United States Patent [19]

Kobushi et al.

[11] Patent Number: 4,897,368

[45] Date of Patent: Jan. 30, 1990

[54] METHOD OF FABRICATING A POLYCIDEGATE EMPLOYING NITROGEN/OXYGEN IMPLANTATION

[75] Inventors: Kazuhiro Kobushi, Osaka; Shuichi Kameyama, Itami; Shozo Okada, Kobe; Kazuhiko Tsuji, Ikoma, all of Japan

[73] Assignee: Matsushita Electric Industrial Co., Ltd., Osaka, Japan

[21] Appl. No.: 195,836

[22] Filed: May 19, 1988

[30] Foreign Application Priority Data

| May 21, 1987 | [JP] | Japan | 62-124221 |
|---|---|---|---|
| Jun. 23, 1987 | [JP] | Japan | 62-155822 |
| Jun. 23, 1987 | [JP] | Japan | 62-155824 |
| Jul. 15, 1987 | [JP] | Japan | 62-176176 |
| Jul. 15, 1987 | [JP] | Japan | 62-176177 |
| Jul. 15, 1987 | [JP] | Japan | 62-176178 |

[51] Int. Cl.$^4$ ............... H01L 21/265; H01L 21/283
[52] U.S. Cl. ............... 437/200; 437/192; 437/190; 437/193; 437/195; 437/202; 437/238; 437/241; 437/24; 437/25; 437/26; 437/41; 357/23.13; 357/64; 357/71; 148/DIG. 19; 148/DIG. 147; 148/DIG. 114; 148/DIG. 82
[58] Field of Search ............... 437/24, 200, 25, 26, 437/192, 195, 190, 193, 238, 241, 202; 148/DIG. 147, DIG. 19, DIG. 114, DIG. 82; 357/71, 64, 23.13

[56] References Cited

U.S. PATENT DOCUMENTS

| 4,406,051 | 9/1983 | Iizuka | 437/41 |
|---|---|---|---|
| 4,551,908 | 11/1985 | Nagasawa et al. | 29/571 |
| 4,558,507 | 12/1985 | Okabayashi et al. | 357/67 |
| 4,683,645 | 8/1987 | Naguib et al. | 437/41 |
| 4,749,660 | 6/1988 | Short et al. | 437/24 |

FOREIGN PATENT DOCUMENTS

| 0005855 | 2/1980 | Japan | 437/24 |
|---|---|---|---|
| 0041537 | 10/1980 | Japan | 437/24 |
| 0021320 | 2/1981 | Japan | 437/24 |
| 0032742 | 4/1981 | Japan | 437/24 |
| 3044388 | 6/1981 | Japan . | |
| 0112032 | 7/1982 | Japan . | |
| 0103124 | 6/1983 | Japan . | |
| 0099774 | 6/1984 | Japan . | |
| 0107576 | 6/1984 | Japan . | |
| 2185624 | 7/1987 | United Kingdom | 437/24 |

OTHER PUBLICATIONS

Einsprach, N. G., VLSI Electronics Microstructure Science, vol. 9, Academic Press, pp. 38–53.
Okabayashi et al., IEEE trans on Electron Services, vol. ED. 31, No. 9, Sep. 1984, pp. 1329–1334.
Okabayashi et al., Layered Structures and Interface Kinetics, edited by S. Furukawa, 1985, pp. 263–272.
Takashi Ito et al., "A Nitrate-Isolated Molybdenum-Polysilicon Gate Electrode for MOS VLSI Circuits," IEEE Transactions on Electron Devices, vol. ED-33, No. 4, 1986, pp. 464–467.

*Primary Examiner*—Olik Chaudhuri
*Assistant Examiner*—T. N. Quach
*Attorney, Agent, or Firm*—Wenderoth, Lind & Ponack

[57] ABSTRACT

Disclosed is a method of fabricating a polycidegate in semiconductor device which has a step of forming a conductor film of polysilicon on a substrate, a step of forming an ion implanted layer by implanting nitrogen ions into the polysilicon conductor film, and a step of forming a low resistance conductor film of titanium on the non-monocyrstalline conductor film. When a field effect transistor is formed by this method, using titanium nitride and/or $TiSi_2$ alloy of the polysilicon conductor and low resistance conductor of titanium by heat treatment as a gate electrode material, the thickness of the alloyed layer is uniform, and breakdown of the gate insulating film due to local diffusion of low resistance conductor is not induced. In other embodiments, oxygen ions and silicon ions are also employed to form thin layers of tunnel oxide and amorphous silicon, respectively.

21 Claims, 8 Drawing Sheets

FIG. 1A

FIG. 1B NITROGEN IONS

METHOD OF FABRICATING A POLYCIDEGATE EMPLOYING NITROGEN/OXYGEN IMPLANTATION

BACKGROUND OF THE INVENTION

This invention relates to a method of fabricating a semiconductor device, and more particularly to a fabricating method capable of improving the electric characteristics of a gate electrode lowered in resistance being composed of polycrystalline conductive film and low-resistance conductive film such as an MOS type integrated circuit, and preventing insulation breakdown of the gate insulating film.

To obtain fine and high performance transistors in a field effect type semiconductor integrated circuit, it is a general practice to lower the resistance of the gate electrode by forming a low resistance conductive film on the gate electrode composed of polycrystalline conductive film and heating it. For example, as a low resistance conductor, a high melting point metal or an alloy thereof with silicon, that is, silicide is deposited on a polycrystalline silicon used as gate electrode, and is heated to about 500° C., so that the high melting point metal or silicide easily reacts with polycrystalline silicon to be entirely transformed into a silicide, thereby lowering the resistance. The sheet resistance of thus formed conductive film is as low as about 1 to 10 Ω/square, and high speed operation of the semiconductor integrated circuit is expected. On the other hand, depending on the kind of metal, it may react with materials than polycrystalline silicon, and in particular since titanium reacts also with a silicon oxide film used as gate electrode material, although it is very low in resistance, it is difficult to use such conductive film as a gate electrode. Hence, tungsten and molybdenum which are slightly higher in resistance than titanium, but hardly react with a silicon oxide film, are generally used. The reactivity and reaction product generating energy between this high melting point metal or silicide with a silicon nitride film or a silicon oxide film are described in Chapter 2 of volume 9 of VLSI Electronics: Microstructure, by N.G. Einsprach (Academic Press). Meanwhile, ease of reaction can be judged by the magnitude of the activation energy, and it is known that the reaction is easier when the activation energy is smaller.

By heat treatment after forming a low resistance conductive film on a gate electrode composed of polycrystalline conductive film, mutual constituent atoms move at the interface between the polycrystalline conductive film and low resistance conductive film, and the vicinity of the interface is alloyed and lowered in resistance. However, in the interface between the crystal grains of the polycrystalline conductor, that is, in the grain boundary, since the bonding force of constituent atoms of the polycrystalline conductor is weak, replacement of constituent atoms of low resistance conductor film with atoms is promoted faster than in the crystal grains, and the low resistance conductor tends to be diffused locally along the grain boundary. When the low resistance conductor is diffused locally and tears the insulation film beneath the gate electrode, the gate electrode is short-circuited with other electrode to lower the reliability of the transistors or the yield of production. To prevent this, a method of depositing an ultrathin silicon nitride film between the polycrystalline conductor and low resistance conductor by CVD (chemical vapor deposition) to inhibit the local diffusion of low resistance conductor and enhance reliability is mentioned in the IEEE Transactions of Electron Devices, Vol., ED-33, No. 4, 1986, pp. 464-467. It is however, difficult to deposit an ultrathin silicon nitride film by CVD at high reproducibility of film thickness, and, still more, it is necessary to deposit at relatively low temperature to prevent change in the electric characteristics due to re-diffusion of impurities in the impurity diffusion layer. Accordingly, it has been difficult to obtain a dense film properties sufficient to inhibit the local diffusion of the low resistance conductor, and improvement of reliability of yield has been inadequate.

SUMMARY OF THE INVENTION

To solve the aforesaid problems, it is a primary object of this invention to present a method of fabricating a semiconductor device enhanced in the reliability of uniformly decreasing the electric resistance of the gate electrode and preventing local diffusion of the low resistance conductor along the grain boundary, by limiting the replacement of the constituent atoms of polycrystalline conductor with the constituent atoms of the low resistance conductor film in the vicinity of the interface of both films.

It is another object of this invention to present a method of fabricating a semiconductor device comprising a step for forming a polycrystalline conductor film on an insulation film, a step of forming an atom introduced layer by introducing at least one kind of atoms into said polycrystalline conductor film, a step of forming a low resistance conductor film on said polycrystalline conductor film, and a step of heating a low resistance conductor film formed on said polycrystalline conductor film, wherein atoms of the low resistance conductor film invading from the surface of polycrystalline conductor film are localized and/or impeded within the atom introduced layer.

According to the fabricating method of this invention, by forming and heating the low resistance conductor film on the gate electrode composed of polycrystalline conductor film to lower the resistance of gate electrode, mutual atom replacement of the constituent atoms of the polycrystalline conductor and constituent atoms of low resistance conductor film can be induced homogeneously only in the limited area at the interface of the two films. Furthermore, the electric resistance of the gate electrode can be uniformly reduced, and local diffusion of low resistance conductor along the grain boundary can be prevented, so that it is possible to present a semiconductor device enhanced in the reliability.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

First embodiment

Referring first to FIGS. 1A to 1F, a first embodiment of this invention is described in details in relation to a metal-oxide-semiconductor (MOS) field effect transistor combining a gate electrode with polycrystalline silicon and titanium.

Figure 1A:
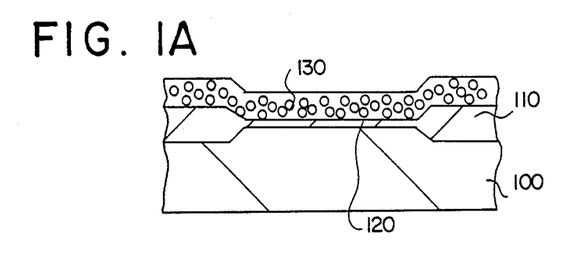
FIGS. 1A to 1F are a sectional view showing a process sequence in a first embodiment of this invention.

(I) On the surface of a silicon substrate 100 except for the area planned to form an active region, an oxide film 110 of about 700 nm was selectively formed as a field oxide film, and a gate oxide film 120 of about 10 nm was formed on the surface of the area planned to form an active region, and a polycrystalline silicon film 130 of about 200 nm was deposited on said oxide films 110 and 120, and phosphorus was diffused by using $POCl_3$ to lower the resistance of the polycrystalline silicon film 130 (FIG. 1A).

(II) In the next step, nitrogen ions were implanted in the polycrystalline silicon film 130 by $1\times10^{15}$ to $1\times10^{18}$ cm$^{-2}$ at an acceleration energy of 15 keV, and an atom introduced layer 140 was formed in the middle of the polycrystalline silicon film 130 (FIG. 1B) to separate the polycrystalline silicon film 130 into two parts, viz., 130a and 130b.

Figure 1B:
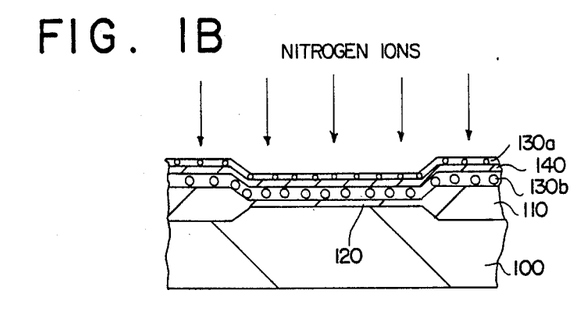
Figure 1C:
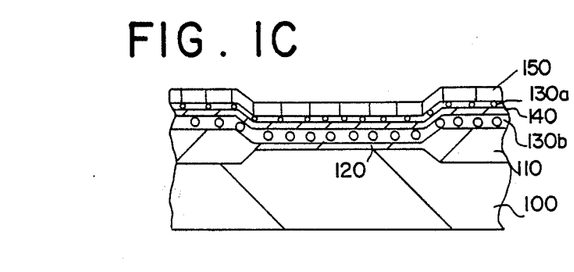

(III) By physical deposition, consequently, a thin titanium film 150 of about 100 nm was deposited (FIG. 1C).

Figure 1D:
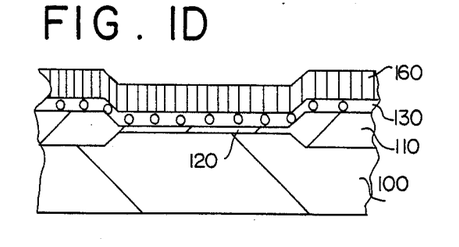

(IV) By rapid thermal annealing at 500° to 1000° C. for 10 seconds or heat treatment by a furnace anneal at 500° to 1000° C. for 30 minutes, titanium nitride and titanium silicide were produced, and an alloyed layer 160 was formed (FIG. 1D).

Figure 1E:
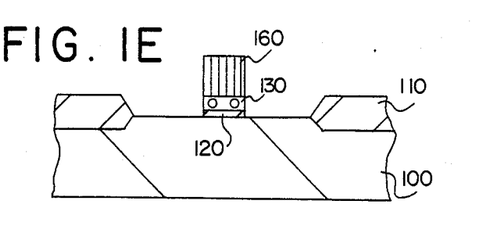

(V) Next, in the photo mask process, a resist pattern was formed, and the other parts than a gate electrode forming area and its periphery were dry-etched, and a gate electrode was formed (FIG. 1E).

Figure 1F:
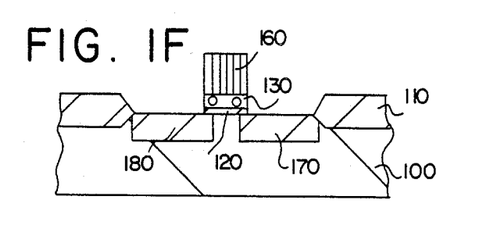

(VI) Finally, by implanting As by $4\times10^{15}$ cm$^{-2}$ ions at an acceleration energy of 80 keV, a source region 170 and a drain region 180 were formed (FIG. 1F).

In this series of processes, a desired field effect transistor was formed. The nitrogen atom introduced layer 140 was more likely to react with titanium than polycrystalline silicon, and the majority of alloying occurred in the atom introduced layer 140 and its upper part. Therefore, since the thickness of alloyed layer was uniform, the electric resistance of the gate electrode became uniform, and also the local diffusion of low resistance conductor hardly occurred, so that the breakdown of the gate oxide film could be prevented.

Meanwhile, in process (II) of the first embodiment, by selectively forming the atom introduced layer in the said polycrystalline layer over the gate oxide film and its peripheral part and using the region in which atoms were not introduced as a low resistance wiring region in subsequent processes, an alloyed layer with the low resistance conductor film spreads over nearly the entire region of the polycrystalline silicon film in this area, and the connection resistance between the polycrystalline silicon and low resistance conductor film can be lowered. Therefore, the conductivity of application of electric field to the gate oxide film is improved. Since the oxide film beneath the wiring region is thick, it does not matter if the low resistance conductor diffuses locally within the oxide film. At this time, the distance from the edge of the gate oxide film to the low resistance wiring region may be preferably defined as follows. That is, since the constituent atoms of the low resistance conductor film diffuse from the low resistance wiring region to invade up to the edge of the gate oxide part through the lower part of the atom introduced region, it is preferable to set the distance longer than this diffusion length.

In this first embodiment of the present invention, as low resistance conductor, titanium was used, and nitrogen was used as the constituent atom of the atom introduced layer, but other high melting point metals or its silicides may be used as the low resistance conductor, and oxygen or silicon or inert atom may be used as the constituent atom of the atom introduced layer without sacrificing the effect to prevent breakdown of the gate insulating film. However, by the combination of the constituent atom of low resistance conductor film and constituent atom or atom introduced layer, the mechanism to prevent breakdown of the gate insulation film varies. In the case of the combination of the first embodiment of this invention of titanium and nitrogen, that is, when the constituent atom of the atom introduced layer is more likely to react with the constituent atom of low resistance conductor rather than with the constituent atom of polycrystalline conductor, constituent atoms of atom introduced layer and constituent atoms of the low resistance conductor react with each other to form a uniform alloyed layer, and local diffusion of the low resistance conductor is inhibited, thereby preventing breakdown of the gate insulating film. And the connection resistance between polycrystalline conductor film and low resistance conductor film is slow, and the endurance of the gate oxide film against the applied electric field is excellent. Or in the case of the combination of tungsten and oxygen, that is, when the constituent atom or atom introducing layer is more likely to react with the constituent atom of polycrystalline conductor film rather than with the constituent atom or the low resistance conductor film, the diffusion of the constituent atom of low resistance conductor film is impeded in the atom introduced layer, and local diffusion of the low resistance conductor is inhibited to prevent electric breakdown of the gate insulating film. Therefore, if the film thickness of the low resistance conductor film is increased for lowering the resistance, breakdown of the gate insulating film may be effective prevented.

Moreover, the atom to be introduced to form the atom introducing layer may be either of one type or of plural types.

Second embodiment

The fabricating method of this invention is further described below by referring to FIGS. 2A to 2G, with respect to an embodiment of field effect transistor combining a gate electrode with polycrystalline silicon and tungsten.

Figure 2A:
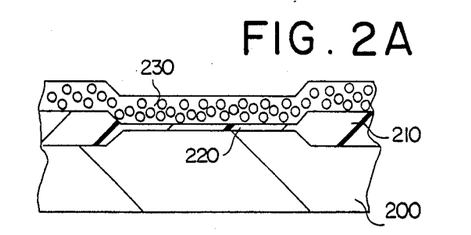
FIGS. 2A to 2G are a sectional view showing a process sequence in a second embodiment of this invention.
Figure 2B:
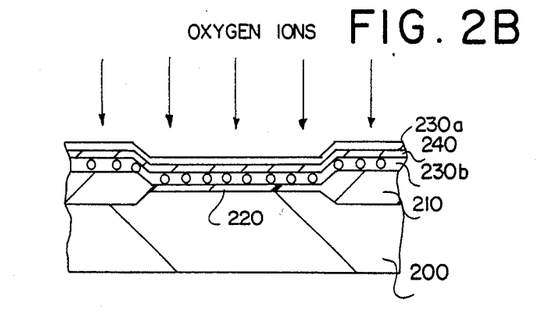

(I) On the surface of a silicon substrate 200 except for the area planned to form an active region, an oxide film 210 of about 700 nm was formed selectively as a field oxide film, and a gate oxide film 220 of about 10 nm was formed on the surface of the area planned to form an active region; a polycrystalline silicon film 230 of about 200 nm was deposited on said oxide films 210 and 220, and phosphorus was diffused by using $POCl_3$ to lower the resistance of the polycrystalline silicon film 230 (FIG. 2A).

(II) Then, implanting oxygen ions into the polycrystalline silicon film 230 by $1\times10^{15}$ to $1\times10^{18}$ cm$^{-2}$ at an acceleration energy of 40 keV, and heating, a first atom introduced layer 240 of silicon oxide was formed in the middle of the polycrystalline silicon film 230 (FIG. 2B) to separate the polycrystalline silicon film 230 into two parts, viz., 230a and 230b.

Figure 2C:
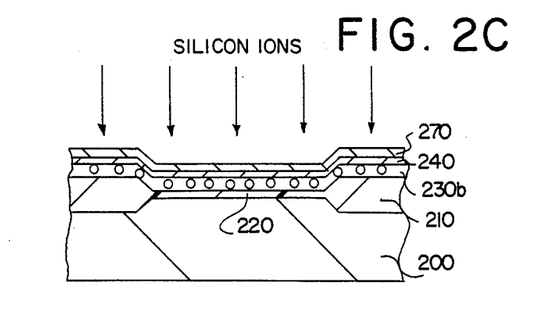

(III) In the next step, silicon ions were implanted on the surface of the polycrystalline silicon film 230 by $1\times10^{15}$ to $1\times10^{18}$ cm$^{-2}$ at an acceleration energy of 2 keV, and by heat treatment a second atom introduced layer 270 composed of amorphous silicon was formed on the surface of polycrystalline silicon film 230 (FIG. 2C).

Figure 2D:
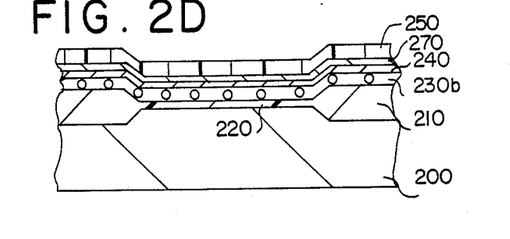

(IV) By physical deposition, a tungsten thin film 250 of about 100 nm was deposited (FIG. 2D).

Figure 2E:
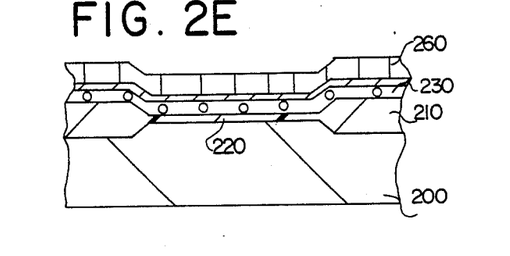

(V) By rapid thermal annealing at 500° to 1000° C. for 10 seconds or heat treatment in electric oven at 500° to 1000° C. for 30 minutes, an alloyed layer 260 of tungsten silicide was formed in the vicinity of the surface of polycrystalline silicon film 230 (FIG. 2E).

Figure 2F:
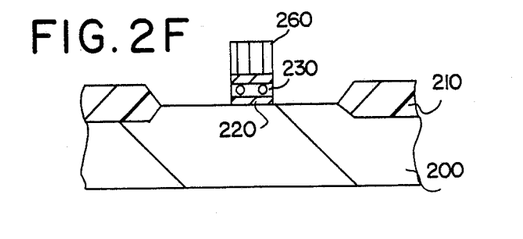

(VI) By forming a resist pattern in the photo mask process, parts other than the gate electrode forming area and its periphery were dry-etched, and a gate electrode was formed (FIG. 2F).

Figure 2G:
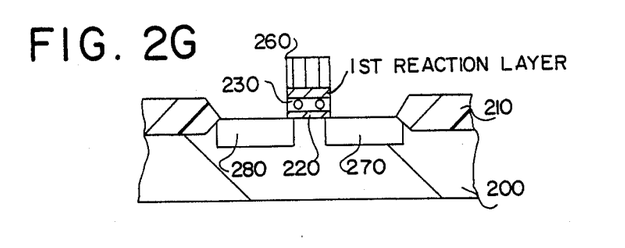

(VII) By implanting As by $4\times10^{15}$ cm$^{-2}$ ions at an acceleration energy of 80 keV, a source region 270 and a drain region 280 were finally formed (FIG. 2G).

In this series of processes, a desired field effect transistor was formed. The amorphous silicon in the second atom introduced layer 270 was more likely to react with tungsten rather than with polycrystalline silicon, and the majority of alloying occured in the atom introducing layer and its upper part. Therefore, an alloyed layer excellent in homogeneity in thickness was obtained. The replacement region of tungsten atoms could be stopped nearly at the second atom introduced layer 270, but some of the tungsten atoms penetrated through this second atom introduced layer 270. However, the silicon oxide in the first atom introduced layer 240 was effective to impede tungsten, and the majority of alloying was limited within the upper part of the atom introducing layer 240. Since the thickness of the alloyed layer 260 was extremely uniform, the electric resistance of the gate electrode was uniform, and local diffusion of low resistance conductor was less likely to occur, so that the breakdown of the gate oxide film could be prevented.

In this invention, as the forming method of the first atom introduced layer, an ion implantation method was employed, but the following method may be also used. That is, on the gate oxide film, a polycrystalline silicon of about 100 nm is deposited as a first layer, and on the surface of the gate electrode forming area and its periphery on this polycrystalline silicon film, a thin silicon oxide film of several nanometers is selectively formed, and a second layer of polycrystalline silicon layer of about 100 nm is deposited, and this selectively formed silicon oxide film of several namometers may be used as the first atom introduced layer. On the other hand, the second atom introduced layer 270 may be selectively formed, and at least it should be formed on the gate electrode forming area and its periphery.

Third embodiment

The fabricating method of this invention is moreover described in details below, while referring to FIGS. 3A to 3G, with respect to an embodiment of field effect transistor combining a gate electrode with polycrystalline silicon and tungsten.

Figure 3A:
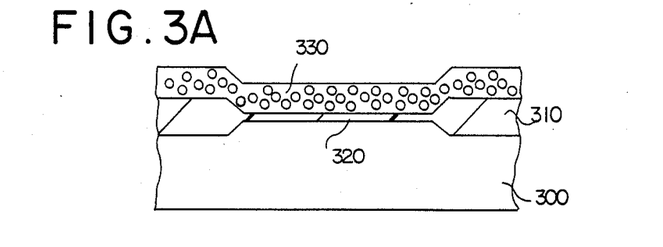
FIGS. 3A to 3G are a sectional view showing a process sequence in a third embodiment of this invention.
Figure 3B:
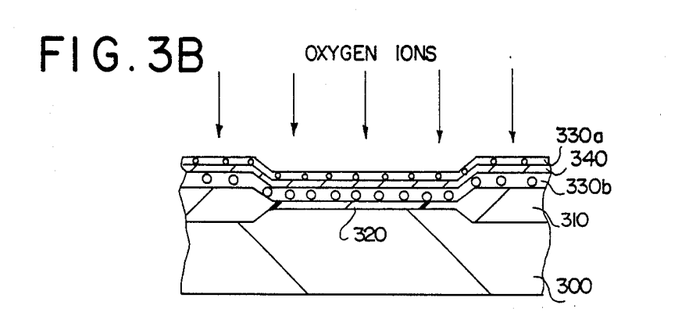

(I) On the surface of a silicon substrate 300 except for the area planned to form an active region, an oxide film 310 of about 700 nm was formed as a field oxide film selectively, and a gate oxide film 320 of about 10 nm was formed on the surface of the area planned for forming an active region, and then a polycrystalline silicon film 330 of about 100 nm was deposited on said oxide films 310 and 320, and phosphorus was diffused by using POCl$_3$ to lower the resistance of the polycrystalline silicon film 330 (FIG. 3A).

(II) Next, by implanting oxygen ions to the polycrystalline silicon film 330 by $1\times10^{15}$ to $1\times10^{18}$ cm$^{-2}$ at an acceleration energy of 10 keV, and heating, a first atom introducing layer 340 of silicon oxide was formed on the surface of the polycrystalline silicon film 330 (FIG. 3B) to separate the polycrystalline silicon film 330 into two parts, viz., 330a and 330b.

Figure 3C:
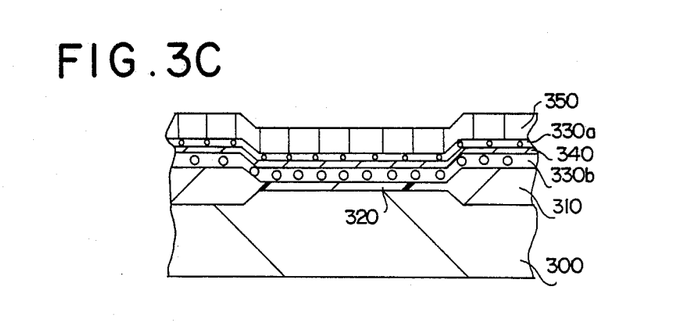

(III) By physical deposition, a tungsten thin film 350 of about 100 nm was deposited (FIG. 3C).

Figure 3D:
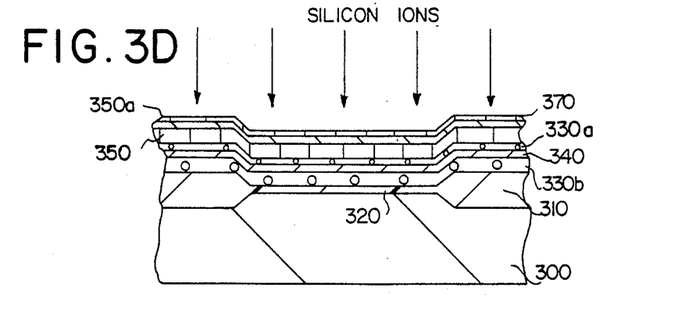

(IV) On the surface of the tungsten thin film 350, silicon ions were implanted by $1\times10^{15}$ to $1\times10^{18}$ cm$^{-2}$ at an acceleration energy of 20 keV, and a second atom introducing layer 370 composed of silicon was formed inside the tungsten thin film 350 (FIG. 3D).

Figure 3E:
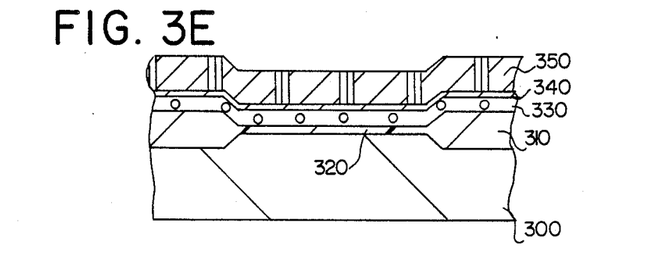

(V) Consequently, by rapid thermal annealing at 500° to 1000° C. for 10 seconds or heat treatment by furnace anneal for 500° to 1000° C. for 30 minutes, an alloyed layer 360 of tungsten silicide was formed inside the tungsten thin film 350 (FIG. 3E).

Figure 3F:
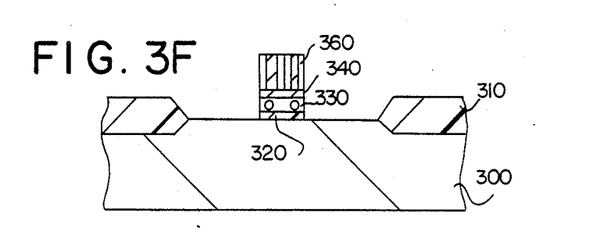

(VI) In the next photo mask process, a resist pattern was formed, and the other portions than the gate electrode forming area and its vicinity were dry-etched, and a gate electrode was formed (FIG. 3F).

Figure 3G:
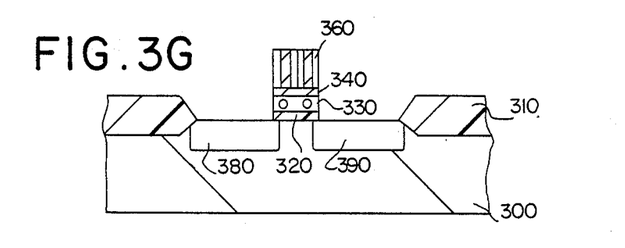

(VII) Finally, by implanting As by $4\times10^{15}$ cm$^{-2}$ ions at an acceleration energy to 80 keV, a source region 370 and a drain region 380 were formed (FIG. 3G).

As a result of this series of processes, a desired field effect transistor was formed. The silicon in the atom introduced layer 370 was not crystalline, and it was more likely to react with tungsten rather than with polycrystalline silicon, and the majority of alloying occurred in the vicinity of the atom introduced layer 370. Hence, an alloyed layer excellent in homogeneity of thickness was obtained. The moving region of tungsten atoms could be nearly localized within the atom introduced layer 370. Some of tungsten atoms were not localized by this atom introducing layer 370, but the silicon oxide in the atom introducing layer 370 was effective to impede the tungsten, and the majority of alloying was limited in the upper part of the atom introducing layer 340. Since the thickness of the alloyed layer 360 was very uniform, the electric resistance of the gate electrode was uniform, and local diffusion of the low resistance conductor hardly occurred, so that breakdown of the gate oxide film could be prevented.

Fourth embodiment

The fabricating method of this invention is described below, together with FIGS. 4A to 4F, relating to a fourth embodiment of a field effect transistor combining a gate electrode with polycrystalline silicon and tungsten.

Figure 4A:
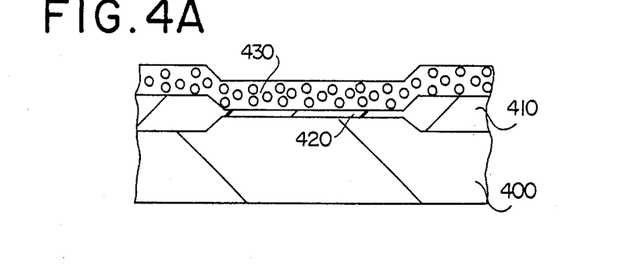
FIGS. 4A to 4F are a sectional view showing a process sequence in a fourth embodiment of this invention.

(I) On the surface of a silicon substrate 400 except for the area planned to form an active region, an oxide film 410 of about 700 nm was formed selectively as a field oxide film, and a gate oxide film 420 of about 10 nm was formed on the surface of the area planned to form an active region, and a polycrystalline silicon film 430 of about 200 nm was deposited on said oxide films 410 and 420, and phosphorus was diffused by using POCl₃ to lower the resistance of the polycrystalline silicon film 430 (FIG. 4A).

Figure 4B:
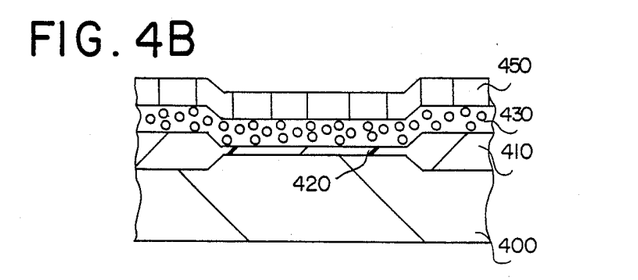

(II) Next, by physical deposition, a tungsten thin film 450 of about 100 nm was deposited (FIG. 4B).

Figure 4C:
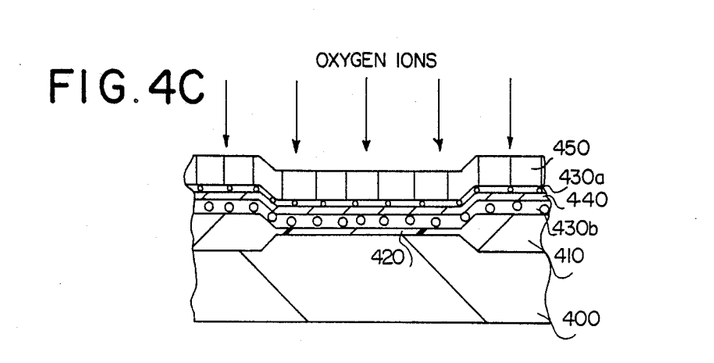

(III) On this tungsten thin film 450, oxygen ions were implanted by $1 \times 10^{15}$ to $1 \times 10^{18}$ cm$^{-2}$ at an acceleration energy of 60 keV, and an atom introducing layer 440 of silicon oxide was formed near the interface between the tungsten thin film 450 and polycrystalline silicon film 430 (FIG. 4C). The ion implanted layer, in fact, separates the silicon film layer 430 into two parts, viz., 430a and 430b.

Figure 4D:
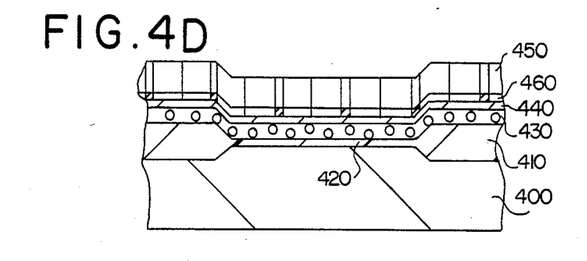

(IV) Then, by rapid thermal annealing at 500° to 1000° C. for 10 seconds, an alloyed layer 460 of tungsten silicide was formed in the vicinity of the interface between the tungsten thin film 450 and polycrystalline silicon film 430 (FIG. 4D).

Figure 4E:
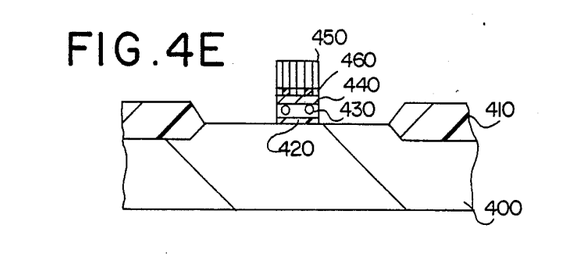

(V) By forming a resist pattern in the photo mask process, the other parts than the gate electrode forming area and its periphery were dry-etched, and a gate electrode was formed (FIG. 4E).

Figure 4F:
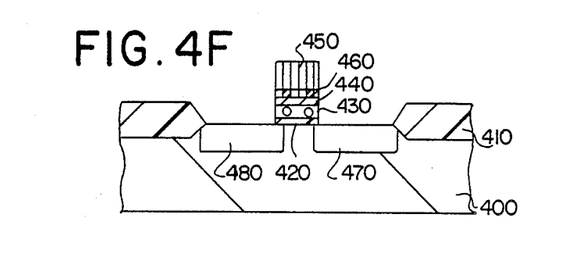

(VI) By implanting As ions by $4 \times 10^{15}$ cm$^{-2}$ at an acceleration energy of 80 keV, a source region 470 and a drain region 480 were formed (FIG. 4F).

In this series of processes, a desired field effect transistor was formed. The silicon oxide of the atom introducing layer 440 was effective to impede tungsten, and the majority of alloying was limited in the upper part of the atom introduced layer. Since the thickness of the alloyed layer 460 was extremely uniform, the electric resistance of the gate electrode became uniform, and local diffusion of low resistance conductor was less likely to occur, and breakdown of gate oxide film could be prevented.

In the fourth embodiment of this invention, the low resistance conductor film was used also after forming the atom introduced layer by implanting ions, but part or whole of this low resistance conductor layer may be removed after forming the atom introduced layer, and the same or different low resistance conductor film may be deposited again. For example, since the thickness of the first low resistance conductor layer used in ion implantation can be reduced, the acceleration energy of the ion implantation may be reduced. Or, without removing the low resistance conductor film, the same or different low resistance conductor film may be deposited to form a multilayer film. For example, by depositing a titanium film on a tungsten film, a further lower resistance may be expected.

In the fourth embodiment of this invention, tungsten was used as the low resistance conductor and oxygen was used as constituent atom of the atom introduced layer, but, same as in the first embodiment, other high melting point metal or its silicide may be used as the low resistance conductor, and if nitrogen, silicon or inert atom is used as the constituent atom of the atom introducing layer, the same effect of preventing breakdown of the gate insulating film is obtained. Likewise, in the case of a combination in which the constituent atom of the atom introduced layer is more likely to react with the constituent atom of the low resistance conductor rather than with the constituent atom of the polycrystalline conductor, a uniform alloyed layer is formed by mutual reaction of the constituent atom of the atom introduced layer and the constituent atom of the low resistance conductor, and local diffusion of the low resistance conductor is inhibited so that the breakdown of the gate insulating film may be prevented. Or in the other combination in which the constituent atom of the atom introduced layer is more likely to react with the constituent atom of the polycrystalline conductor rather than with the constituent atom of the low resistance conductor, diffusion of the constituent atom in the low resistance conductor is inhibited in the atom introduced layer, and local diffusion of the low resistance conductor is inhibited, so that breakdown of the gate insulating film is also prevented.

When a field effect transistor is formed according to the method of this invention by using an alloyed form of polycrystalline silicon by heat treatment as gate electrode material, the thickness of the alloyed layer becomes uniform as stated above, and breakdown of the gate insulating film due to local diffusion of the low resistance conductor may be prevented. As a preferred embodiment of this invention, when an atom introduced layer was formed by high dose ion implantation method, the electric charge on the surface occurring during ion implantation may be effectively removed through the low resistance conductor film, so that the electric breakdown of the gate insulating film can be also prevented.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method of fabricating a semiconductor device comprising:
    (a) forming an insulating film on a surface of a semiconductor substrate;
    (b) forming a polycrystalline conductor film on said insulating film;
    (c) forming an ion implanted layer within the body of said polycrystalline conductor film by ion-implantation;
    (d) forming a low resistance conductor film on said polycrystalline conductor film in which said ion implanted layer is formed;
    (e) annealing said low resistance conductor film and said polycrystalline conductor film by heat treatment to at least partially mix the films as to form an alloy layer on top of the polycrystalline conductor film; and
    (f) patterning said alloy layer film and said polycrystalline conductor film into a low resistance wiring pattern;
    whereby the ion implanted layer serves to prevent the atoms composing the low resistance conductor film from diffusing by said heat treatment into the lower part of said polycrystalline conductor film through the ion implanted layer and reaching to said insulating film.

2. The method of claim 1, wherein the insulating film is used as a gate insulating film.

3. The method of claim 2, wherein the ion implanted layer is selectively formed in the polycrystalline conductor film only on the area which has been previously determined to form an active region of semiconductor device and in the vicinity thereof,
    whereby a distance from the low resistance wiring pattern which does not contain the ion implanted layer to an edge of the gate insulating film is set such that it is longer than the diffusion length of the atoms composing the low resistance conductor film which invade, by diffusion, from the low resistance wiring pattern through the lower part of the ion implanted layer and up to the gate insulating film.

4. The method of claim 1, wherein annealing heat treatment in step (e) is carried out at a temperature of 500° to 1000° C.

5. A method of fabricating a semiconductor device comprising:
   (a) forming an insulating film on a surface of a semiconductor substrate;
   (b) forming a polycrystalline conductor film on said insulating film;
   (c) forming a low resistance conductor film on said polycrystalline conductor film;
   (d) forming an ion implanted layer within the body of said polycrystalline conductor film by ion-implantation;
   (e) annealing said low resistance conductor film and said polycrystalline conductor film by heat treatment to at least partially mix these films to form an alloy layer on top of the polycrystalline conductor film; and
   (f) patterning said alloy layer and said polycrystalline conductor film into a low resistance wiring pattern,
   whereby the ion implanted layer is used for preventing the atoms composing the low resistance conductor film from diffusing by the heat treatment into the lower part of said polycrystalline conductor film through the ion implanted layer and reaching into said insulating film.

6. The method of claim 5, wherein the low resistance conductor film formed on the polycrystalline conductor film is removed after forming the ion implanted layer, and a low resistance conductor film is formed again on the polycrystalline conductor film,
   whereby the low resistance conductor film is used for preventing the polycrystalline conductor film from charging-up by the ion-implantation.

7. The method of claim 6, wherein a plurality of low resistance conductor film are formed on the polycrystalline conductor film to form a multilayer low resistance conductor film as the low resistance conductor film.

8. The method of claim 5, wherein annealing heat treatment in step (e) is carried out at a temperature of 500° to 1000° C.

9. The method of fabricating a semiconductor device comprising:
   (a) forming an insulating film on a surface of a semiconductor substrate;
   (b) forming a polycrystalline conductor film on said insulating film;
   (c) forming a first ion implanted layer within the body of said polycrystalline conductor film by ion-implantation;
   (d) forming a second ion implanted layer in said polycrystalline conductor film by ion-implantation at a smaller depth than the said first ion implanted layer;
   (e) forming a low resistance conductor film on said polycrystalline conductor film in which said two ion implanted layers are formed;
   (f) annealing said low resistance conductor film and said polycrystalline conductor film by heat treatment to at least partially mix these films so as to form an alloy layer on top of the polycrystalline conductor film; and
   (g) patterning said alloy layer and said polycrystalline conductor film into a low resistance wiring pattern;
   whereby the ion implanted layers are used for preventing the atoms composing the low resistance conductor film from diffusing by the heat treatment into the lower part of said polycrystalline conductor film through the second ion implanted layer and reaching into said insulating film.

10. The method of claim 9, wherein at least the first ion implanted layer is formed in the polycrystalline conductor film selectively only on an area which has been predetermined to form an active region of semiconductor device and in the vicinity thereof,
    whereby a distance from the low resistance wiring pattern without the first ion implanted layer to an edge of the gate insulating film is set longer than the diffusion length of the atoms composing the low resistance conductor film invading up to the gate insulating film from the low resistance wiring pattern through the lower part of the first ion implanted layer.

11. The method of claim 9, wherein annealing heat treatment in step (f) is carried out at a temperature of 500° to 1000° C.

12. The method of fabricating a semiconductor device comprising:
    (a) forming an insulating film on a surface of a semiconductor substrate;
    (b) forming a polycrystalline conductor film on said insulating film;
    (c) forming a first ion implanted layer within the body of said polycrystalline conductor film by ion-implantation;
    (d) forming a low resistance conductor film on said polycrystalline conductor film in which said first ion-implantation layer is formed;
    (e) forming a second ion implanted layer in said low resistance conductor film by ion-implantation;
    (f) annealing said low resistance conductor film and said polycrystalline conductor film by heat treatment to at least partially mix these films so as to form an alloy layer on top of the polycrystalline conductor film; and
    (g) patterning said alloy layer and said polycrystalline conductor film into a low resistance wiring pattern;
    whereby the ion implanted layers are used for preventing the atoms composing the low resistance conductor film from diffusing by the heat treatment into the lower part of said polycrystalline conductor film through the second ion implanted layer and reaching into said insulating film.

13. The method of claim 12, wherein at least the first ion implanted layer is formed in the polycrystalline conductor film selectively only on the area which has been predetermined to form an active region of the semiconductor device and in the vicinity thereof,
    whereby a distance from the low resistance wiring pattern without the first ion implanted layer to an edge of the gate insulating film is set longer than the diffusion length of the atoms composing the low resistance conductor film which invade, by diffusion, from the low resistance wiring pattern through the lower part of the first ion implanted layer up to the gate insulating film.

14. The method of claim 12, wherein annealing heat treatment in step (f) is carried out at a temperature of 500° to 1000° C.

15. The method of fabricating a semiconductor device comprising:
   (a) forming an insulating film on a surface of a semiconductor substrate;
   (b) forming a first polycrystalline conductor film on said insulating film;
   (c) forming an ion implanted layer within the body of said polycrystalline conductor film by ion-implantation;
   (d) forming a polycrystalline conductor film on the polycrystalline conductor film in which said ion implanted layer is formed;
   (e) repeating the above previous two steps as least once;
   (f) forming a low resistance conductor film on the top of polycrystalline conductor film; and
   (g) annealing said low resistance conductor film and said second polycrystalline conductor film by heat treatment to at least partially mix these films to form an alloy layer.

16. The method of fabricating a semiconductor device comprising:
   (a) forming an insulating film on a surface of a semiconductor substrate;
   (b) forming a first polycrystalline conductor film on said insulating film;
   (c) forming a first ion implanted layer within the body of said first polycrystalline conductor film by ion-implantation;
   (d) forming a multilayer polycrystalline conductor film on said first polycrystalline conductor film in which said ion implanted layer is formed;
   (e) forming a low resistance conductor film on the top of said multilayer polycrystalline conductor film;
   (f) forming a second ion implanted layer in said low resistance conductor film by ion-implantation; and
   (g) annealing said low resistance conductor film and said second polycrystalline conductor film by heat treatment to at least partially mix these films and form an alloy layer.

17. The method of fabricating a semiconductor device comprising:
   (a) forming an insulating film on a surface of a semiconductor substrate;
   (b) forming a low resistance polycrystalline silicon film on said insulating film;
   (c) forming a nitrogen ion implanted layer within the body of said low resistance polycrystalline silicon film by ion-implantation;
   (d) forming a metal-silicide film on said low resistance polycrystalline silicon film in which said nitrogen ion implanted layer is formed;
   (e) annealing said metal-silicide film and said low resistance polycrystalline silicon film by heat treatment to at least partially mix these films and form an alloy layer; and
   (f) patterning said low resistance polycrystalline silicon film and said metal-silicide film into a low resistance wiring pattern;
   whereby the ion implanted layer is used for preventing the atoms composing the low resistance conductor film from diffusing by the heat treatment into the lower part of said polycrystalline conductor film through the ion implanted layer and reaching to said insulating film, and
   wherein said nitrogen ion implanted layer is used for preventing the atoms composing the metal-silicide film from diffusing by the heat treatment into the lower part of said low resistance polycrystalline silicon film through the nitrogen ion implanted layer and reaching into to said insulating film.

18. The method of claim 17, wherein the insulating film is used as a gate insulating film.

19. The method of claims 1, 5, 9, 12 or 17, wherein the step of patterning the low resistance conductor film and the polycrystalline conductor film is carried out before the step of mixing the low resistance conductor film and the polycrystalline conductor film.

20. The method of claims 1, 5, 9, 12 or 17, wherein the step of patterning the low resistance conductor film and the polycrystalline conductor film is carried out after the step of mixing the low resistance conductor film and the polycrystalline conductor film.

21. The method of claim 15, 16 or 17, wherein the annealing heat treatment is carried out at a temperature of 500° to 1000° C.

* * * * *